(12) United States Patent
Umeda

(10) Patent No.: US 9,184,318 B2
(45) Date of Patent: Nov. 10, 2015

(54) SOLAR CELL ELEMENT, PROCESS FOR MANUFACTURING SOLAR CELL ELEMENT, AND SOLAR CELL MODULE

(75) Inventor: Kotaro Umeda, Amagasaki (JP)

(73) Assignee: KYOCERA Corporation, Kyoto (JP)

( * ) Notice: Subject to any disclaimer, the term of this patent is extended or adjusted under 35 U.S.C. 154(b) by 312 days.

(21) Appl. No.: 13/702,389

(22) PCT Filed: Jun. 27, 2011

(86) PCT No.: PCT/JP2011/064672
§ 371 (c)(1),
(2), (4) Date: Dec. 6, 2012

(87) PCT Pub. No.: WO2011/162406
PCT Pub. Date: Dec. 29, 2011

(65) Prior Publication Data
US 2013/0074924 A1    Mar. 28, 2013

(30) Foreign Application Priority Data
Jun. 25, 2010  (JP) ................................. 2010-144393

(51) Int. Cl.
*H01L 31/042*  (2014.01)
*H01L 31/0224* (2006.01)
*H01L 31/048*  (2014.01)
*H01L 31/18*   (2006.01)

(52) U.S. Cl.
CPC ...... *H01L 31/022433* (2013.01); *H01L 31/048* (2013.01); *H01L 31/18* (2013.01); *Y02E 10/50* (2013.01)

(58) Field of Classification Search
CPC ........ H01L 31/00–31/078; Y02E 10/50–10/60
USPC ................................... 136/243–265
See application file for complete search history.

(56) References Cited

U.S. PATENT DOCUMENTS

2007/0209697 A1* 9/2007 Karakida et al. ............. 136/256
2010/0132792 A1* 6/2010 Kim et al. .................... 136/258

FOREIGN PATENT DOCUMENTS

| JP | H03-247792 A | 11/1991 |
| JP | H06-053531 A | 2/1994 |
| JP | 2000-294819 A | 10/2000 |
| JP | 2003-338631 A | 11/2003 |
| JP | 2005-150540 A | 6/2005 |

OTHER PUBLICATIONS

International Preliminary Report on Patentability issued for International Application No. PCT/JP2011/064672.

* cited by examiner

*Primary Examiner* — Bach Dinh
(74) *Attorney, Agent, or Firm* — Procopio, Cory, Hargreaves & Savitch LLP

(57) ABSTRACT

The present invention relates to a solar cell element that comprises: a semiconductor substrate; and a collector electrode including a plurality of conductor portions elongated in a first direction on one main surface of the semiconductor substrate, and the plurality of the conductor portions comprise: a linear first conductor region; and a linear second conductor region including a plated surface, the linear second conductor region being electrically connected to the first conductor region.

5 Claims, 7 Drawing Sheets

F I G . 1
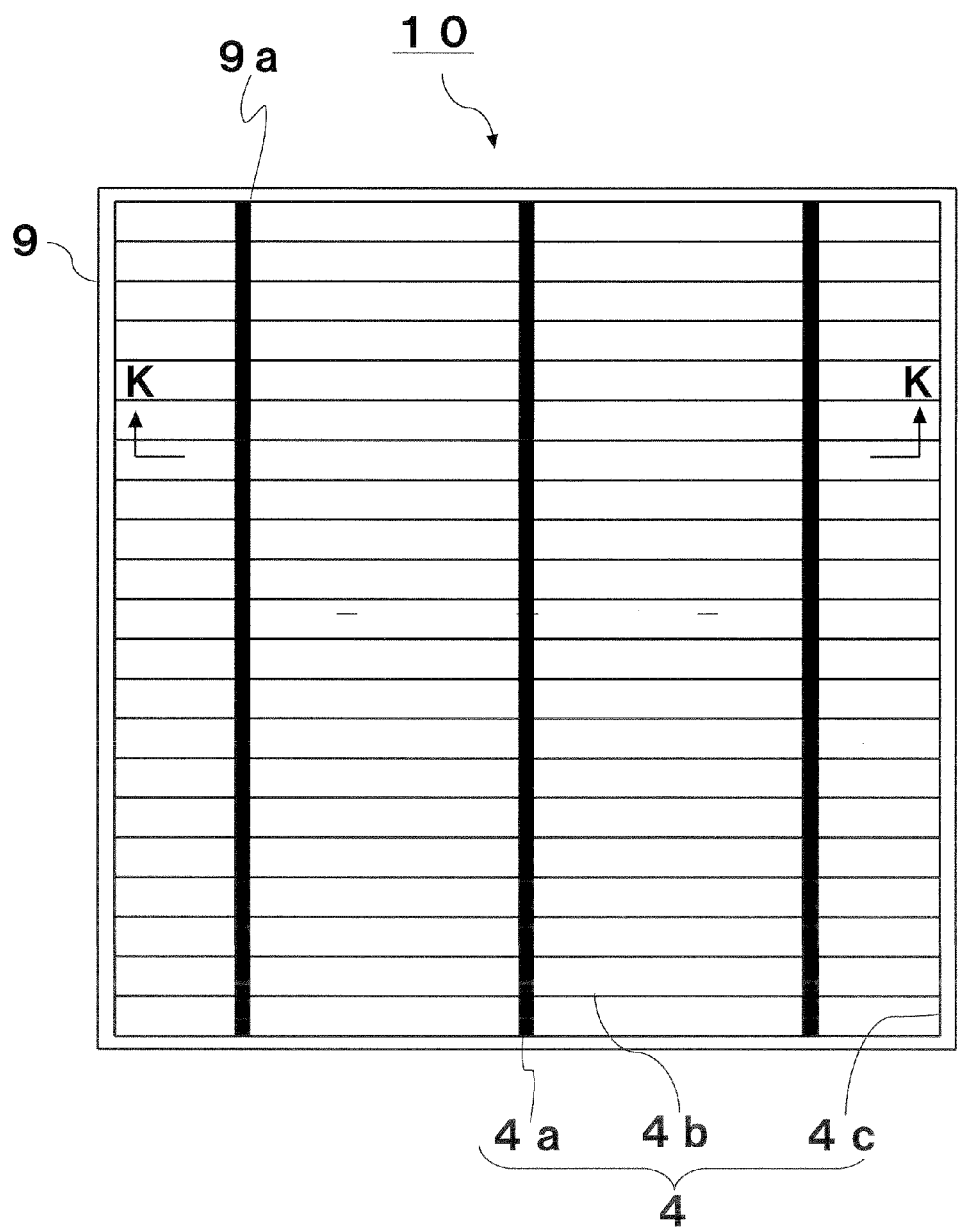

SOLAR CELL ELEMENT, PROCESS FOR MANUFACTURING SOLAR CELL ELEMENT, AND SOLAR CELL MODULE

TECHNICAL FIELD

The present invention relates to a solar cell element and a method for manufacturing the solar cell element, and also concerns a solar cell module including one or more of the solar cell elements.

BACKGROUND ART

In a solar cell element which uses a semiconductor substrate comprised of silicon or the like, in general, electrodes to be formed on a light-receiving surface side of the semiconductor substrate include a plurality of linear collector electrodes having a narrow width and an output extraction electrode having a width wider than the line width of the collector electrode, the output extraction electrode intersecting with these collector electrodes. Moreover, in order to increase a quantity of received light of the solar cell elements, the line width of the collector electrodes formed on the light-receiving surface side is made narrower (for example, see Japanese Patent Application Laid-Open No. 6-53531).

SUMMARY OF THE INVENTION

Problem to be Solved by the Invention

In this case, however, since the line resistivity of the electrode itself becomes higher when the line width of the collector electrodes is made narrower, the resulting solar cell element might have a low power generation efficiency. For this reason, there have been strong demands for a solar cell element provided with a collector electrode having such an appropriately narrow line width as not to impair characteristics, and a method for manufacturing a solar cell element having high productivity.

In view of the above objects, the present invention has been devised, and its object is to provide a solar cell element that can reduce the line resistivity of a collector electrode to improve the output characteristic, and has superior productivity, and a method for manufacturing the solar cell element as well as a solar cell module.

Means to Solve the Problem

A solar cell element in accordance with one aspect of the present invention comprises: a semiconductor substrate; and a collector electrode including a plurality of conductor portions elongated in a first direction on one main surface of the semiconductor substrate, and the plurality of the conductor portions comprise: a linear first conductor region; and a linear second conductor region including a plated surface, the linear second conductor region being electrically connected to the first conductor region.

The above-mentioned solar cell element may refer to a solar cell element (type I), in which the plurality of conductor portions comprise a first conductor portion including the first conductor region and a second conductor portion including the second conductor region, and on one main surface of the semiconductor substrate, of the plurality of aligned conductor portions, the first conductor region is located on one side in a second direction orthogonal to the first direction, and the second conductor region is located on the other side in the second direction relative to the first conductor region.

Moreover, the above-mentioned solar cell element may refer to a solar element (type II), in which each of the plurality of conductor portions comprises a conductor portion including the first conductor region and the second conductor region; and in the conductor portion, the first conductor region is located on one side in the first direction, and the second conductor region is located on the other side in the first direction relative to the first conductor region.

In the case of type I, a method for manufacturing a solar cell element in accordance with one aspect of the present invention includes two methods (method I and method II).

Method I comprises: a substrate preparing step of preparing a semiconductor substrate; a first conductor region forming step of forming a conductor portion which includes a linear first conductor region, by applying a first conductive paste onto one main surface of the semiconductor substrate as a long linear shape in a first direction so that the first conductive paste is located on one side in a second direction orthogonal to the first direction, and then firing the resultant paste; a second conductor region forming step of forming a conductor portion which includes a linear second conductor region, by applying a second conductive paste onto the one main surface of the semiconductor substrate as a long linear shape in the first direction so that the second conductive paste is located on the other side in the second direction relative to a portion at which the first conductor region is located, and then firing the resulting paste; a connecting step of electrically connecting the first conductor region with the second conductor region; and a plating step of connecting a power feeding unit for applying an electric current for electrolytic plating to the first conductor region, as well as immersing the second conductor region in an electrolytic plating solution together with a portion of the semiconductor substrate so that the surface of the second conductor region is plated.

Method II comprises the same substrate preparing step, the same first conductor region forming step and the same second conductor region forming step as those steps of method I, and further comprises: a connecting step of forming an output extraction electrode so as to connect the first conductor region and the second conductor region; and a plating step of connecting a power feeding unit for applying an electric current for electrolytic plating to the output extraction electrode, as well as immersing the second conductor region in an electrolytic plating solution together with a portion of the semiconductor substrate so that the surface of the second conductor region is plated.

A manufacturing method of type II comprises: a substrate preparing step of preparing the semiconductor substrate; a first conductor region forming step of forming a linear first conductor region, by applying a first conductive paste onto one main surface of the semiconductor substrate as a long linear shape in a first direction so that the first conductive paste is located on one side in the first direction, and then firing the resulting paste; a second conductor region forming step of forming a conductor portion including the first conductor region and a linear second conductor region, by applying a second conductive paste onto the one main surface of the semiconductor substrate as a long linear shape in a first direction so that the second conductive paste is located on the other side in the first direction relative to a portion at which the first conductor region is located, and second conductive paste is also electrically connected to the first conductor region, and then firing the resulting paste; a plating step of connecting a power feeding unit for applying an electric current for electrolytic plating to the first conductor region, as well as immersing the second conductor region in an electrolytic plating solution together with a portion of the semiconductor substrate so that the surface of the second conductor region is plated.

Moreover, a solar cell module in accordance with one aspect of the present invention is provided with the above-mentioned solar cell element.

Effects of the Invention

In accordance with the solar cell element, the method for manufacturing the same and the solar cell module, since the line resistivity of the electrode can be reduced, the width of the electrode can be narrowed so that it becomes possible to improve the output characteristics of the solar cell element and the solar cell module, and consequently to improve the productivity.

BRIEF DESCRIPTION OF DRAWINGS

FIG. 1 is a plan view schematically showing a first surface side of one example of a solar cell element in accordance with one embodiment of the present invention.

FIG. 4A is a plan view viewed from a first surface side; FIG. 4B is an enlarged plan view showing a plane shape of a conductive layer corresponding to a portion E in FIG. 4A; FIG. 4C is a cross-sectional view taken along line F-F of a first electrode in FIG. 4A; and FIG. 4D is a cross-sectional view taken along line G-G of the first electrode in FIG. 4A.

FIG. 5A is a plan view viewed from a first surface side; FIG. 5B is an enlarged plan view showing a plane shape of a conductive layer corresponding to a portion H in FIG. 5A; FIG. 5C is a cross-sectional view taken along line I-I of a first electrode in FIG. 5A; and FIG. 5D is a cross-sectional view taken along line J-J of the first electrode in FIG. 5A.

FIG. 7A is an exploded cross-sectional view thereof, and FIG. 7B is a plan view in which the solar cell module is viewed from a light-receiving surface side.

EMBODIMENT FOR CARRYING OUT THE INVENTION

Referring to drawings, the following description will describe embodiments of the present invention in detail.

Solar Cell Element

<Basic Structure of Solar Cell Element>

Figure 2:
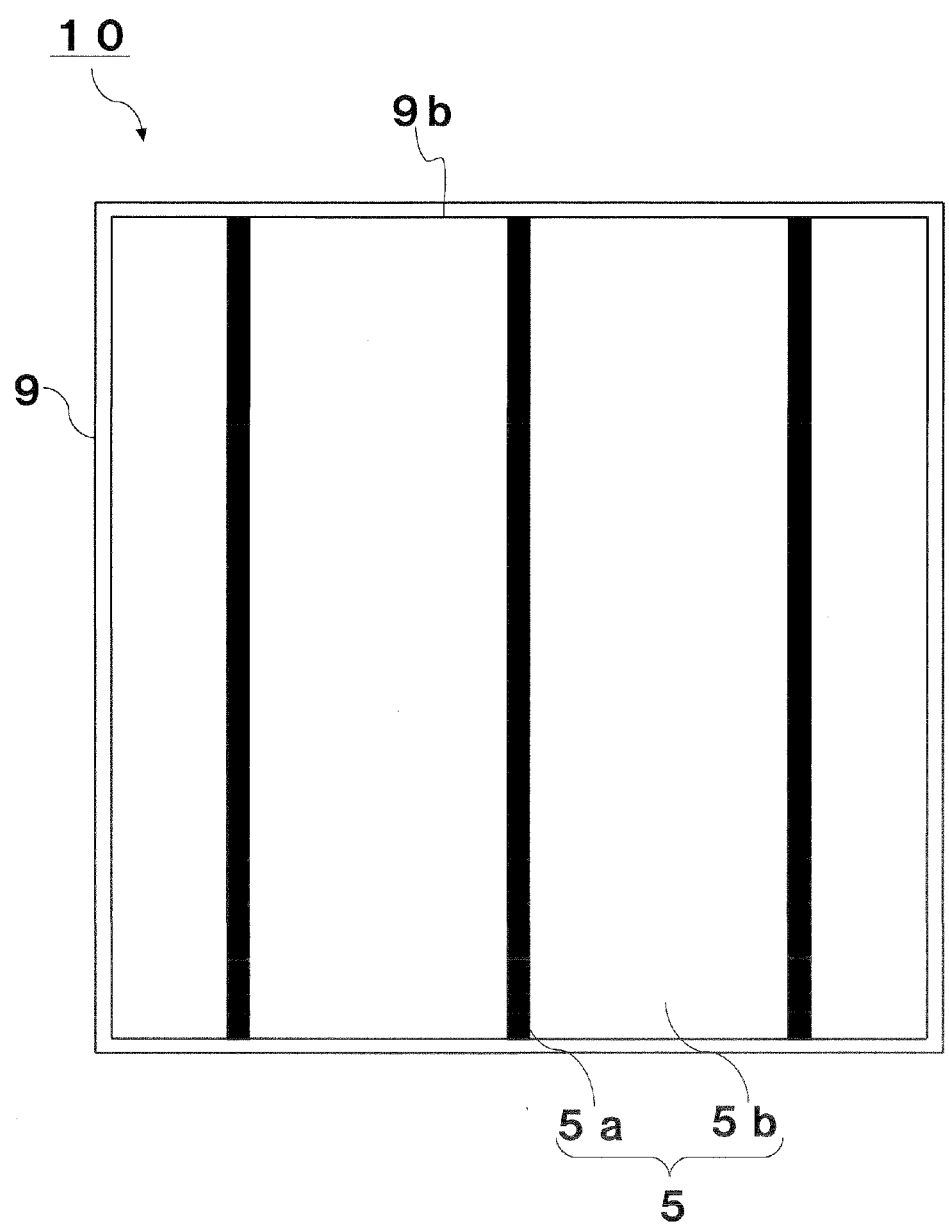
FIG. 2 is a plan view schematically showing a second surface side of the example of the solar cell element in accordance with the one embodiment of the present invention.
Figure 3:
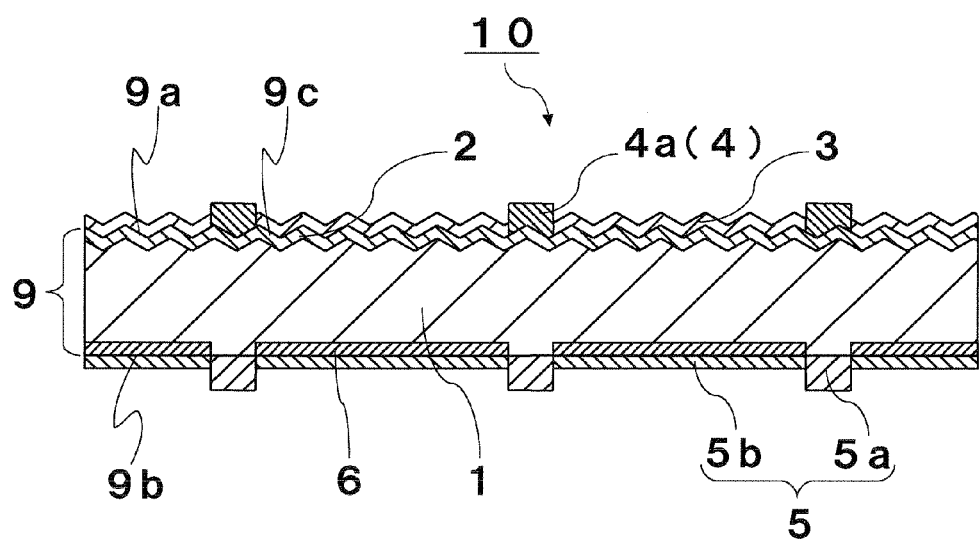
FIG. 3 is a view schematically showing the example of the solar cell element in accordance with the one embodiment of the present invention, and is a cross-sectional view taken along line K-K in FIG. 1.

First, referring to FIGS. 1 to 3, the following description will describe a basic structure of a solar cell element 10 in accordance with one embodiment of the present invention.

The solar cell element 10 is mainly provided with a semiconductor substrate 9 including a light-receiving surface 9a (hereinafter, referred to as "First Surface") on which light is made incident and a non-light-receiving surface 9b (hereinafter, referred to as "Second Surface") that is a rear surface of the first surface 9a. The semiconductor substrate 9 is constituted by one conductivity-type region 1 and a reverse conductivity-type layer 2 formed on the surface layer of the semiconductor substrate 9. An anti-reflection layer 3 serving as an anti-reflection film may be formed on the first surface 9a of the semiconductor substrate 9 (in the present embodiment, on the reverse conductivity-type layer 2).

Moreover, the solar cell element 10 is provided with first electrodes 4 formed on the first surface 9a of the semiconductor substrate 9 and second electrodes 5 formed on the second surface 9b of the semiconductor substrate 9. Here, as shown in FIG. 1, the first electrodes 4 include first output extraction electrodes 4a linearly formed as a plurality of stripes and first collector electrodes 4b linearly formed as a plurality of stripes, each having a line width narrower than that of each first output extraction electrodes 4a. The first electrodes 4 may be further provided with linear auxiliary electrodes 4c that connect the first collector electrodes 4b with each other. The auxiliary electrodes 4c are, for example, formed linearly on two ends of each first collector electrode 4b.

In this manner, the solar cell element 10 is provided with the semiconductor substrate 9 and the first collector electrodes 4b, each including conductor portions formed as a plurality of stripes elongated in a first direction (in a lateral direction in FIG. 1) on the first surface 9a that is one main surface of the semiconductor substrate 9, and each of the plurality of stripe-shaped conductor portions is provided with a linear first conductor region and a linear second conductor region that is electrically connected to the first conductor region and includes a plated surface.

With respect to the above solar cell element 10, for example, in a solar cell element 10 (type I) shown in FIGS. 4A to 4D, when the first surface 9a of the semiconductor substrate 9 is viewed on its plan view, the plurality of stripe-shaped conductor portions forming the first collector electrodes 4b include a conductor portion comprised of the first conductor region and a conductor portion comprised of the second conductor region. Moreover, among the plurality of aligned stripe-shaped conductor portions, the first conductor region is positioned on one side in a second direction (vertical direction in FIG. 4A) orthogonal to a first direction (lateral direction in FIG. 4A). The second conductor region is positioned on the other side in the second direction relative to the first conductor region. That is, in the solar cell element 10 of type I, a first conductor layer 11a forming the first conductor region is placed in the conductor portion on one side in the second direction, and a second conductor layer 11b forming the second conductor region and a plated layer 12 are placed in the conductor portion on the other side in the second direction relative to the first conductor layer 11a. The second conductor layer 11b forms a base for use in carrying out a plating process on its surface.

Moreover, in the case of a solar cell element 10 (type II) shown in FIGS. 5A to 5D, each of the first collector electrodes 4b includes a conductor portion including a first conductor region and a second conductor region. Moreover, in these conductor portions, the first conductor region is positioned on one side in a first direction, and the second conductor region is positioned on the other side in the first direction relative to the first conductor region. That is, a first conductor layer 11a forming the first conductor region is placed in the conductor portion on one side in the first direction (lateral direction in FIG. 5A) of the first surface 9a of the semiconductor substrate 9, and a second conductor layer 11b forming the second conductor region, and a plated layer 12 are placed in the conductor portion on the other side in the first direction relative to the first conductor layer 11a.

As described above, the solar cell element 10 of the present embodiment is provided with the first collector electrodes 4b including a plurality of stripe-shaped conductor portions that are elongated in a first direction when the first surface 9a of the semiconductor substrate 9 is viewed on its plan view, and the first collector electrodes 4b are provided with the linear first conductor layer 11a, the linear second conductor layer 11b having a line width narrower than that of the first conductor layer 11a and the plated layer 12 formed on the second conductor layer 11b.

<Specific Structure of Solar Cell Element>

The following description will describe a specific structure of the solar cell element 10. As the semiconductor substrate 9 to be prepared, a crystalline silicon substrate, such as a single crystalline silicon substrate or a polycrystalline silicon substrate, that contains a predetermined dopant element (conductivity-type controlling impurity) and exerts one conductivity-type (for example, p-type), is used. The thickness of this semiconductor substrate 9 is preferably set to, for example, 250 μm or less, more preferably, 150 μm or less. Although not particularly limited, the planar shape of the semiconductor substrate 9 is preferably formed into a square shape. This shape is preferable from the viewpoint of the manufacturing method, the viewpoint of assembling a solar cell module by arranging a large number of solar cell elements 10 and the like.

The following description will describe an example in which as the semiconductor substrate 9 to be prepared, a crystalline silicon substrate that exerts the p-conductivity-type is used. In an attempt to allow the semiconductor substrate 9 comprised of a crystalline silicon substrate to exert the p-type, for example, boron or gallium is preferably used as its dopant element.

The reverse conductivity-type layer 2 is a layer that exerts a conductivity-type reversed to that of the one conductivity-type region 1 mainly forming the semiconductor substrate 9, and is formed in the surface layer of the first surface 9a of the semiconductor substrate 9. In the case where a silicon substrate exerting the p-conductivity-type is used as the semiconductor substrate 9 to be prepared, the reverse conductivity-type layer 2 is formed so as to exert the n-conductivity-type. In contrast, in the case where a silicon substrate exerting the n-conductivity-type is used as the semiconductor substrate 9 to be prepared, the reverse conductivity-type layer 2 is formed so as to exert the p-conductivity-type. Moreover, between the p-conductivity-type region and the n-conductivity-type region, a pn-junction portion is formed. In the case where the semiconductor substrate 9 to be prepared is a silicon substrate that exerts the p-conductivity-type, the reverse conductivity-type layer 2 can be formed, for example, by diffusing an impurity such as phosphorus or the like on the first surface 9a of the silicon substrate.

The anti-reflection layer 3 reduces the reflectance of light within a desired wavelength range to increase the amount of light generating carriers, thus making it possible to improve a photoelectric current density Jsc of the solar cell element 10. The anti-reflection layer 3 is comprised of, for example, a silicon nitride film, a titanium oxide film, a silicon oxide film, a magnesium oxide film, an indium tin oxide film, a tin oxide film, a zinc oxide film or the like. The thickness of the anti-reflection layer 3 is appropriately selected depending on materials to be used, and set to such a thickness as to achieve non-reflection conditions relative to proper incident light. For example, in the semiconductor substrate 9 comprised of silicon, the refractive index of the anti-reflection layer 3 is preferably set to about 1.8 to 2.3, and its thickness is preferably set to about 500 to 1200 Å. Moreover, the case where a silicon nitride film is used as the anti-reflection layer 3 is preferable because a passivation effect is also obtained.

A BSF (Back Surface Field) region 6 has a function for reducing a reduction of the effect due to a recombination of carriers near the second surface 9b of the semiconductor substrate 9, and is used for forming an inner electric field on the second surface 9b side of the semiconductor substrate 9. The BSF region 6 has the same conductivity-type as that of the one conductivity-type region 1, and a dopant element is located with a higher concentration than the concentration of the dopant contained in the one conductivity-type region 1. In the case where the one conductivity-type region 1 has the p-type, the BSF region 6 is preferably formed by diffusing a dopant element such as boron and aluminum on the second surface 9b of the semiconductor substrate 9 so as to have a dopant element concentration of about $1 \times 10^{18}$ to $5 \times 10^{21}$ atoms/cm$^3$. In this manner, the BSF region 6 is formed in the surface layer portion on the second surface 9b side of the semiconductor substrate 9.

As shown in FIG. 1, the first electrode 4 is provided with the first output extraction electrode 4a and the plurality of linear first collector electrodes 4b. At least one portion of the first output extraction electrode 4a intersects with the first collector electrodes 4b. The first output extraction electrode 4a has, for example, a width of about 1.3 to 2.5 mm, and two or more of these are preferably installed. The first collector electrodes 4b have a linear shape having a width of about 40 to 150 μm; thus, the line width thereof is narrower than that of the first output extraction electrode 4a. Moreover, the plurality of first collector electrodes 4b are installed to be spaced from each other with intervals of about 1 to 3 mm. The thickness of the first electrode 4 is about 10 to 40 μm.

As shown in FIGS. 4A to 4D or FIGS. 5A to 5D, the first electrode 4 is provided with the first conductor layers 11a formed on one end portions side of the semiconductor substrate 9 and the second conductor layers 11b having a line width narrower than that of the first conductor layer 11a, the second conductor layers 11b being formed on the other end portion side of the semiconductor substrate 9, and the first electrode 4 is further provided with the plated layers 12 formed on the second conductor layers 11b respectively. Since the conductor layer 11 is formed by applying and firing a metal paste, its porosity becomes higher than 5%. The plated layer 12 is formed so as to have a porosity of 5% or less. The thickness of the conductor layer 11 is about 1 to 10 μm, and the thickness of the plated layer 12 is about 5 to 30 μm.

The following description will describe the electrode structures more specifically.

Figure 4A:
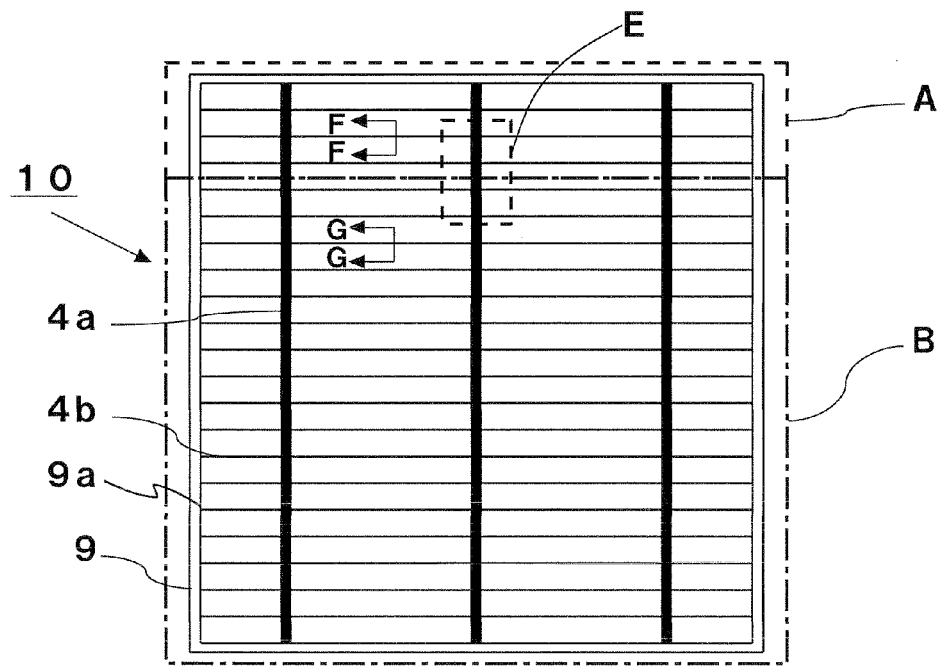
FIGS. 4A to 4D are views schematically showing the one example of the solar cell element in accordance with the one embodiment of the present invention.
Figure 4B:
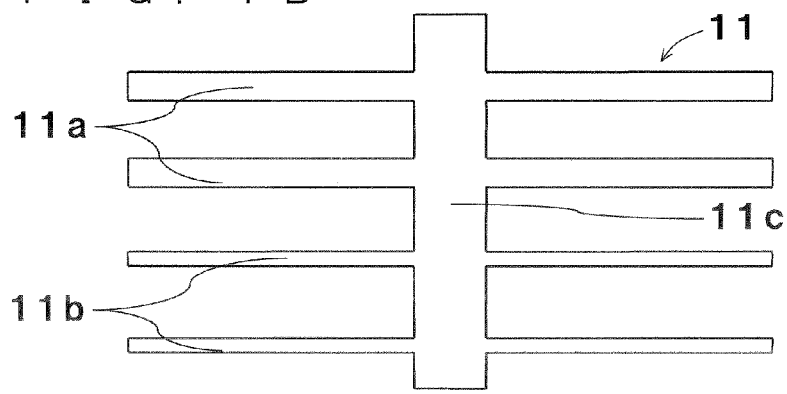
Figure 4C:
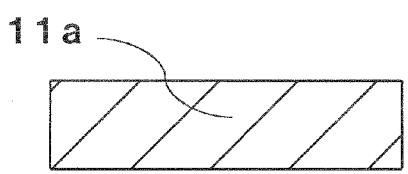
Figure 4D:
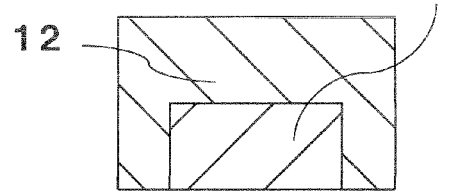

First, an explanation will be given to one example of an electrode structure of type I. As shown in FIGS. 4A to 4D, the first output extraction electrode 4a and the first collector electrode 4b, located within a range of about 5 to 50 mm from one end portion (upper end of the semiconductor substrate 9 shown in FIG. 4 A) of the semiconductor substrate 9 (that is, of a first range A and a second range B corresponding to two ranges surrounded by broken lines shown in FIG. 4A, within the narrower first range A), are not provided with the plated layers 12. In contrast, the first output extraction electrode 4a and the first collector electrode 4b, located within the wider second range B in FIG. 4A, are provided with the plated layers 12.

In this case, the conductor layer of the first collector electrode 4b, located within the first range A, is defined as a first conductor layer 11a, the conductor layer 11 of the first collector electrode 4b, located within the second range B, is defined as a second conductor layer 11b, and the conductor layer 11 of the first output extraction electrode 4a is defined as a third conductor layer 11c. In this case, at least the first conductor layer 11a is formed so as to have a line width wider than that of the second conductor layer 11b. That is, the first conductor layer 11a is formed on one end portion side of the semiconductor substrate 9 that intersects with the longitudinal direction of the first output extraction electrode 4a. Since the first collector electrode 4b located within the second range B includes the plated layer 12, it becomes possible to reduce a line resistivity of the electrode. For this reason, it is possible to make the width of the second conductor layer 11b narrower, and the first collector electrode 4b, located within the first range A, makes it possible to prevent the line resistivity of the electrode from becoming higher by making the line width of the first conductor layer 11a wider.

Additionally, the third conductor layer 11c of the first output extraction electrode 4a located within the first range A may have a line width wider than that of the third conductor layer 11c located within the second range B; however, since the first output extraction electrode 4a has a line width that is sufficiently wider than that of the first collector electrode 4b, the line width of the third conductor layer 11c does not have to be changed between the first range A and the second range B.

Next, an explanation will be given to one example of an electrode structure of type II.

Figure 5A:
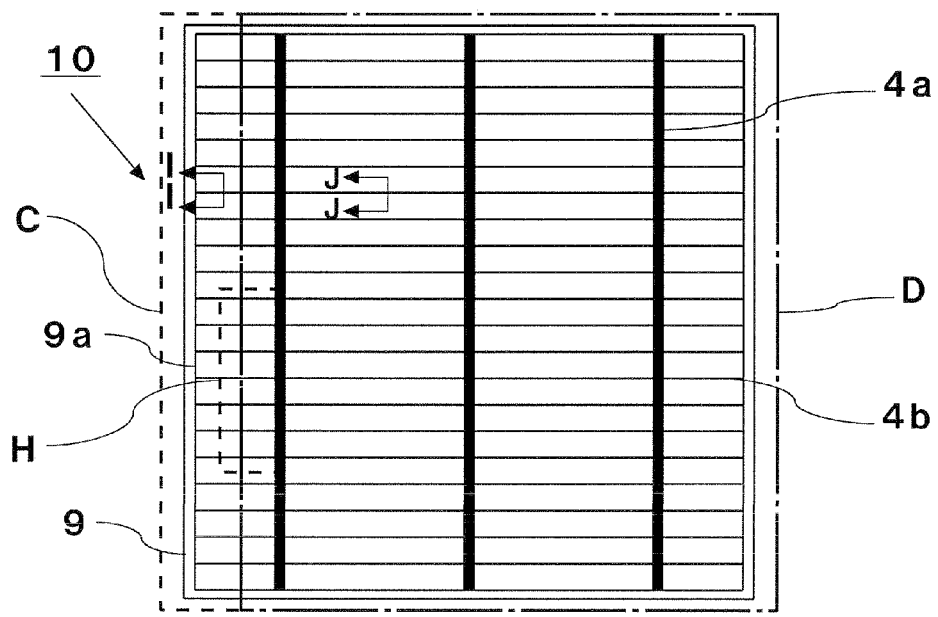
FIGS. 5A to 5D are views schematically showing one example of a solar cell element in accordance with one embodiment of the present invention.
Figure 5B:
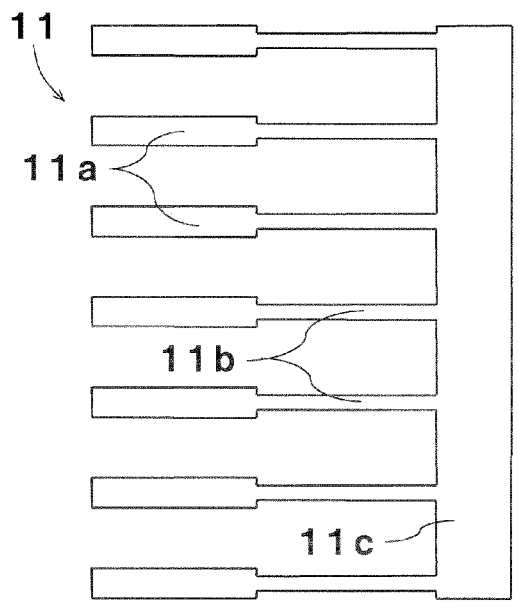
Figure 5C:
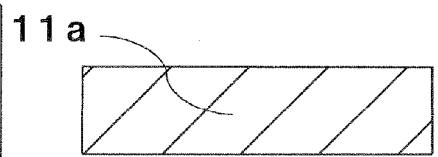
Figure 5D:
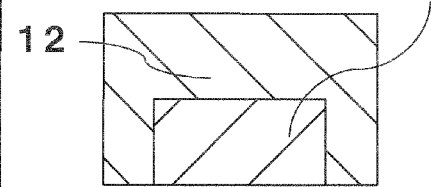

As shown in FIGS. 5A to 5D, the first collector electrode 4b, located within a range of about 5 to 10 mm from one end portion (left end of the semiconductor substrate 9 shown in FIG. 5A) of the semiconductor substrate 9 (that is, of a third range C and a fourth range D corresponding to two ranges surrounded by broken lines shown in FIG. 5A, within the narrower third range C), is not provided with the plated layers 12. In contrast, the first output extraction electrode 4a and the first collector electrode 4b, located within the wider fourth range D in FIG. 5A, are provided with the plated layers 12.

In this case, the conductor layer 11 of the first collector electrode 4b, located within the third range C, is defined as a first conductor layer 11a, the conductor layer 11 of the first collector electrode 4b, located within the fourth range D, is defined as a second conductor layer 11b, and the conductor layer 11 of the first output extraction electrode 4a is defined as a third conductor layer 11c. In this case, the first conductor layer 11a is formed so as to have a line width wider than that of the second conductor layer 11b. That is, the first conductor layer 11a is formed on one end portion side of the semiconductor substrate 9 that intersects with the longitudinal direction of the first collector electrode 4b. Since the first collector electrode 4b located within the fourth range D includes the plated layer 12, it becomes possible to reduce a line resistivity of the electrode; thus, it is possible to make the width of the second conductor layer 11b narrower, and the first collector electrode 4b, located within the third range C, makes it possible to prevent the line resistivity of the electrode from becoming higher by making the line width of the first conductor layer 11a wider.

The width of the first conductor layer 11a only needs to be set approximately to a width including the plated layer 12 covering the periphery of the second conductor layer 11b, the width being wider than the width of the second conductor layer 11b by about 5 to 30 μm.

As shown in FIG. 2, the second electrode 5 is provided with a second output extraction electrode 5a and a second collector electrode 5b. The thickness of the second output extraction electrode 5a of the present embodiment is about 10 to 30 μm, and the width thereof is about 1.3 to 7 mm. The second output extraction electrode 5a can be formed by using virtually the same materials and method as those of the above-mentioned first electrode 4. Moreover, the second collector electrode 5b has a thickness of about 15 to 50 μm, and is formed on virtually the entire surface of the second surface 9b of the semiconductor substrate 9 except for a portion of the second output extraction electrode 5a thereof. The second collector electrode 5b is formed, for example, by applying an aluminum paste in a desired shape, and then firing the resulting paste.

<Basic Method for Manufacturing Solar Cell Element>

The following description will describe a basic method for manufacturing the above-mentioned solar cell element 10. The following explanation will be given to each of the types of electrode structures. Referring to FIGS. 4A to 4D, the explanation will be given to the solar cell element 10 of type I. Moreover, referring to FIGS. 5A to 5D, the explanation will be given to the solar cell element 10 of type II.

First, the following description will describe the method for manufacturing a solar cell element 10 of type I. The method for manufacturing the solar cell element 10 of type I is provided with a substrate preparation process for preparing a semiconductor substrate 9, a first conductor region forming process, a second conductor region forming process, a connecting process for electrically connecting the first conductor region and the second conductor region with each other, and a plating process.

The connecting process may be a process for forming a first output extraction electrode 4a for connecting the first conductor region and the second conductor region with each other.

The first conductor region forming process is a process in which a first conductor layer 11a corresponding to a conductor portion comprised of a linear first conductor region is formed by applying a first conductive paste onto one main surface of the semiconductor substrate 9 as a long linear shape in a first direction so as to be positioned on one side in a second direction orthogonal to the first direction, and then firing the resulting paste.

The second conductor region forming process is a process in which a second conductor layer 11b corresponding to a conductor portion comprised of a linear second conductor region is formed by applying a second conductive paste onto the one main surface of the semiconductor substrate 9 as a long linear shape in the first direction so as to be positioned on the other side in the second direction relative to the portion where the first conductor region is located, and then firing the resulting paste. In this case, the first conductive paste for use in the first conductor region forming process and the second conductive paste for use in the second conductor region forming process may be the same material.

Upon forming the first output extraction electrode 4a in the connecting process, a third conductor layer 11c for connecting the first conductor layer 11a with the second conductor layer 11b is formed, and this third conductor layer 11c is used as a constituent element of the first output extraction electrode 4a.

In the plating process, a power feeding unit for applying an electric current for electrolytic plating is connected to the first conductor layer 11a of the first conductor region, and the second conductor layer 11b of the second conductor region is immersed in an electrolytic plating solution together with a portion of the semiconductor substrate 9, in a manner so as not to immerse the power feeding unit therein, so that a plated layer 12 is formed on the second conductor layer 11b (method I).

In the connecting process, in the case where a first output extraction electrode 4a for connecting the first conductor region and the second conductor region with each other is formed, the power feeding unit may be connected to the third conductor layer 11c (first output extraction electrode 4a) with a wide line width in the plating process (method II). With this arrangement, the electric connection between the power feeding unit and the third conductor layer 11c is positively made so that the surface of the second conductor layer 11b is desirably plated.

In this case where the first conductor region forming process, the second conductor region forming process and the connecting process are carried out by a single process, this method is desirable because the solar cell element 10 can be quickly manufactured more easily.

Moreover, the method for manufacturing the solar cell element 10 of type II is provided with a substrate preparation process for preparing a semiconductor substrate 9, a first conductor region forming process, a second conductor region forming process and a plating process.

The first conductor region forming process is a process in which a first conductor layer 11a corresponding to a linear first conductor region is formed by applying a first conductive paste onto one main surface of the semiconductor substrate 9 as a long linear shape in a first direction so as to be positioned on one side in the first direction, and then firing the resulting paste.

The second conductor region forming process is a process in which a conductor portion provided with a first conductor layer 11a corresponding to the first conductor region and a second conductor layer 11b corresponding to the linear second conductor region is formed by applying a second conductive paste onto the one main surface of the semiconductor substrate 9 as a long linear shape in the first direction so as to be positioned on the other side in the first direction relative to the portion where the first conductor layer 11a corresponding to the first conductor region is positioned, in a manner so as to be electrically connected to the first conductor layer 11a, and then firing the resulting paste.

In the plating process, a power feeding unit for applying an electric current for electrolytic plating is connected to the first conductor layer 11a corresponding to the first conductor region, and the second conductor layer 11b corresponding to the second conductor region is immersed in an electrolytic plating solution together with a portion of the semiconductor substrate 9 so that the surface of the second conductor layer 11b is plated.

In this case where the first conductor region forming process and the second conductor region forming process are carried out by a single process, this method is desirable because the solar cell element 10 can be quickly manufactured more easily.

<Specific Method for Manufacturing Solar Cell Element>

The following description will describe a specific method for manufacturing the solar cell element 10 by exemplifying type I. Additionally, in the case of type II also, the above basic manufacturing method may be applied by using the same materials and conditions as those of type I.

First, a substrate preparation process for preparing a semiconductor substrate 9 is explained. In the case where the semiconductor substrate 9 is a single crystalline silicon substrate, a substrate, for example, produced by a pulling method or the like, is prepared. Moreover, in the case where the semiconductor substrate 9 is a polycrystalline silicon substrate, a substrate, for example, prepared by a casting method or the like, is prepared. In the following description, an explanation will be given by exemplifying a method in which a p-type polycrystalline silicon is used as the semiconductor substrate 9 to be prepared.

First, an ingot of polycrystalline silicon is formed by using, for example, a casting method. Next, the ingot is sliced into pieces, for example, with a thickness of 250 μm or less. Thereafter, in order to cleanse a mechanically damaged layer and a contaminated layer on the cut surface of the sliced semiconductor substrates, it is preferable to carry out a slight amount of etching on the surface by using a solution, such as NaOH or KOH, or hydrofluoric acid or nitric-hydrofluoric acid. Additionally, after the etching process, it is preferable to carry out a wet etching method or a dry etching method so as to further form a fine uneven structure 9c on the surface of the semiconductor substrate 9, as shown in FIG. 3.

Next, an n-type reverse conductivity-type layer 2 is formed in the surface layer of the first surface 9a of the semiconductor substrate 9. This reverse conductivity-type layer 2 is formed by using a method, such as coating and thermal-diffusion method in which $P_2O_5$ in a paste state is applied onto the surface of the semiconductor substrate 9 and thermally diffused therein, a vapor-phase thermal diffusion method which uses phosphorus oxychloride ($POCl_3$) in a gas state as a diffusion source, or an ion implantation method which directly diffuses phosphorus ions. This reverse conductivity-type layer 2 is formed in a depth of 0.2 to 2 μm with a sheet resistivity of about 60 to 150Ω/. Additionally, the method for forming the reverse conductivity-type layer 2 is not limited to the above-mentioned methods, and for example, an amorphous silicon hydride film, a crystalline silicon film containing a fine crystalline silicon film, or the like may be formed by using a thin-film forming technique. Moreover, an i-type silicon region may be formed between the semiconductor substrate 9 and the reverse conductivity-type layer 2.

Next, an anti-reflection layer 3 is formed. The anti-reflection layer 3 is formed by using, for example, a PECVD (Plasma Enhanced Chemical Vapor Deposition) method, a vapor-deposition method, a sputtering method, or the like. For example, upon forming the anti-reflection layer 3 comprised of a silicon nitride film by using the PECVD method, a mixed gas of silane ($SiH_4$) and ammonia ($NH_3$) is diluted with nitrogen ($N_2$) with the inside of a reaction chamber being set to about 500° C., and formed into a plasma by glow discharge decomposition and deposited, so that the anti-reflection layer 3 is formed.

Next, a BSF region 6 in which a semiconductor impurity of one conductivity-type is diffused at a high concentration is formed on a second surface 9b side of the semiconductor substrate 9. As a manufacturing method for this, for example, a method in which by using a thermal diffusion method with boron tribromide ($BBr_3$) serving as a diffusion source, the BSF region 6 is formed at a temperature of about 800 to 1100° C. and a method in which, after applying an aluminum paste including aluminum (Al) powder and an organic vehicle and the like by a printing method, a heat treatment (firing) is carried out at a temperature of 600 to 850° C. so that aluminum is diffused into the semiconductor substrate 9, may be used. Moreover, in the case where the method for printing an aluminum paste and firing the paste is used, a desired diffusion region can be formed only on a printing surface, and it is not necessary to remove an n-type reverse conductivity-type layer 2 that has also been formed on the second surface 9b side simultaneously when the reverse conductivity-type layer 2 is formed, and isolation of the pn-junction region may be carried out by using a laser beam or the like only on peripheral portions on the first surface 9a side or the second surface 9b side. Additionally, the formation method of the BSF region 6 is not limited by the above-mentioned methods, and for example, by using a thin-film forming technique, amorphous silicon hydride film, a crystalline silicon film containing a fine crystalline silicon film, or the like may be formed. Moreover, an i-type silicon region may be formed between the one conductivity-type region 1 and the BSF region 6.

Next, the first electrode 4 (first output extraction electrode 4a, first collector electrode 4b) and the second electrode 5 (second output extraction electrode 5a, second collector electrode 5b) are formed in the following manner.

The first electrode 4 is formed by using an electrode paste (silver paste) containing metal powder, for example, comprised of silver (Ag) or the like, an organic vehicle and glass frit. This silver paste is applied onto the first surface 9a of the semiconductor substrate 9, and by then carrying out a firing process at a maximum temperature of 600 to 850° C. for about several tens of seconds to several tens of minutes, the anti-reflection layer 3 is penetrated by a fire through method, and the conductor layer 11 of the first electrode 4 is formed on the semiconductor substrate 9. As the application method of the electrode paste, a screen printing method or the like may be used. After the application process, the layer is preferably heated to a predetermined temperature so as to evaporate and dry the solvent. The conductor layer 11 includes the first conductor layer 11a formed on one end portion side of the semiconductor substrate 9, and the second conductor layer 11b having a line width narrower than that of the first conductor layer 11a and formed on the other end side of the semiconductor substrate 9. By adjusting the width of the aperture portions of a screen through which the electrode paste passes, the conductor layer 11 having a desired shape can be obtained, and both of the first conductor layer 11a and the second conductor layer 11b can be formed by one process.

Figure 6:
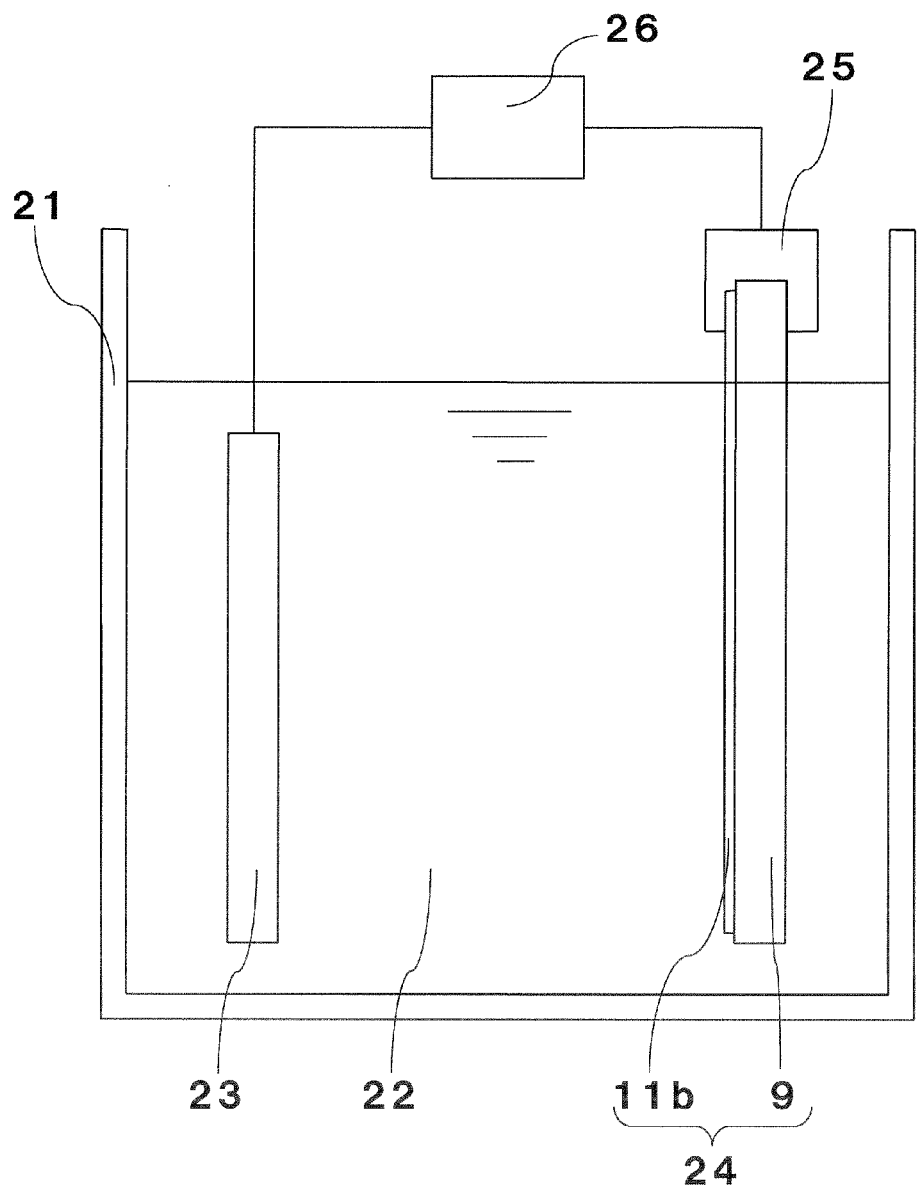
FIG. 6 is a cross-sectional view schematically showing a plating device to be used for a method for manufacturing a solar cell element in accordance with one embodiment of the present invention.

Next, as shown in FIG. 6, the semiconductor substrate 9 is immersed in a plating bath 21 in which an electrolytic plating solution 22 is accommodated so that a plated layer 12 is formed on the second conductor layer 11b. An anode 23 comprised of a metal member is set/placed with respect to an electrolytic plating solution 22 inside the plating bath 21. On the other hand, the semiconductor substrate 9 on which the second conductor layer 11b is formed as a plating subject is placed as a cathode 24. A power feeding unit 25 comprised of a conductive clip or the like is attached to the first conductor layer 11a so that the second conductor layer 11b serves as the cathode 24. Moreover, only the portion on which the second conductor layer 11b is formed on the semiconductor substrate 9 is immersed in the electrolytic plating solution 22. Then, by applying a voltage between the anode 23 and the cathode 24 from a power supply 26, a current is allowed to flow so that a plated layer 12 is formed on the second conductor layer 11b. In this case, since at least a portion of the first conductor layer 11a and the power feeding unit 25 are not immersed in the electrolytic plating solution 22, no plated layer 12 is formed thereon.

Since the power feeding unit 25 is also immersed in the electrolytic plating solution 22 in the conventional manufacturing method, the plated layer is also formed on the power feeding unit 25. For this reason, since the plated layer formed on the power feeding unit 25 needs to be removed, for example, by being immersed in an etching solution prior to the next processing of the semiconductor substrate, the productivity is lowered. In contrast, in the manufacturing method in accordance with the present embodiment, since no plated layer is formed on the power feeding unit 25 as described earlier, no removing process for the plated layer is required so that the productivity can be greatly improved. Moreover, since the first conductor layer 11a, which has not been immersed in the electrolytic plating solution 22, has a line width wider than that of the second conductor layer 11b, it is possible to prevent the line resistivity of the electrode from becoming higher. Therefore, in accordance with the manufacturing method of the present embodiment, the productivity of the solar cell element 10 can be improved while maintaining its output characteristic.

As the plated layer 12, copper, silver, tin, or the like may be used. At this time, a plating solution containing metal forming the plated layer is used for the electrolytic plating solution 22, and the metal member of the anode 23 is also formed by using a plate of the metal forming the plated layer. Moreover, an insoluble metal member may be used as the anode 23, and titanium coated with iridium oxide or titanium coated with platinum, or the like, is used. For example, in the case where copper is used as the plated layer 12, a copper sulfate plating solution, a copper pyrophosphate plating solution, a copper cyanide plating solution, or the like may be used as the electrolytic plating solution 22, and a copper plate comprised of copper containing phosphorus is used as a metal member for the anode 23.

In the case where the semiconductor substrate 9 is immersed in the plating bath 21 in the longitudinal direction of the first output extraction electrode 4a, the first conductor layer 11a is placed on one end portion side of the semiconductor substrate 9, the one end portion intersecting with the longitudinal direction of the first output extraction electrode 4a. Moreover, the power feeding unit 25 is attached to the first conductor layer 11a (first collector electrode 4b) or the third conductor layer 11c (first output extraction electrode 4a) located on the one end portion side, and the plated layer 12 is formed on the second conductor layer 11b and a portion of the third conductor layer 11c that have been immersed in the electrolytic plating solution 22 so that the first output extraction electrode 4a and the first collector electrode 4b are formed.

In the case where the semiconductor substrate 9 is immersed in the plating bath 21 in the longitudinal direction of the first collector electrode 4b, the first conductor layer 11a is placed on one end portion side of the semiconductor substrate 9 that intersects with the longitudinal direction of the first collector electrode 4b. Moreover, the power feeding unit 25 is attached to the first conductor layer 11a located on the one end portion side, and the plated layer 12 is formed on the second conductor layer 11b and the third conductor layer 11c that have been immersed in the electrolytic plating solution 22 so that the first output extraction electrode 4a and the first collector electrode 4b are formed.

The following description will describe the second electrode 5. First, the second collector electrode 5b is formed, for example, by using an aluminum paste containing aluminum powder and an organic vehicle. This paste is applied to virtually the entire surface of the second surface except for one portion of a portion on which the second output extraction electrode 5a is formed. As the application method, a screen printing method or the like may be used. It is preferable that the solvent is evaporated and dried at a predetermined temperature after application as above from the viewpoint that the paste is hardly adhered to other portions at the time of the operation.

Next, the second output extraction electrode 5a is formed by using a silver paste containing, for example, metal powder comprised of silver powder or the like, an organic vehicle and a glass frit. This silver paste is applied in a predetermined shape. Additionally, by applying the silver paste at a position where it is in contact with one portion of the aluminum paste, one portion of the second output extraction electrode 5a and one portion of the second collector electrode 5b are overlapped with each other. As the application method, a screen printing method or the like may be used. After the application process, a heating process is preferably carried out at a predetermined temperature so that the solvent is evaporated to be dried.

Moreover, the semiconductor substrate 9 is fired in a firing furnace at a maximum temperature of 600 to 850° C. for about several tens of seconds to several tens of minutes so that the second electrode 5 is formed on the second surface 9b side of the semiconductor substrate 9.

In this case, although the second electrode 5 is formed by using printing and firing methods, it may be formed by using a thin-film forming method such as a vapor deposition or sputtering method, or a plating method.

As described above, a solar cell element 10 having a superior output characteristic can be easily produced rapidly.

Additionally, the present invention is not limited to the above embodiments, and various modifications and changes may be made therein within the scope of the present invention as described below.

For example, a passivation film may be formed on the second surface 9b side of the semiconductor substrate 9. This passivation film has a function for reducing re-combinations of carriers on the second surface 9b that is a rear surface of the semiconductor substrate 9. As the passivation film, Si-based nitride film, such as silicon nitride ($Si_3N_4$) and amorphous Si nitride film (a-SiNx), silicon oxide ($SiO_2$), aluminum oxide ($Al_2O_3$), titanium oxide ($TiO_2$) or the like may be used. The thickness of the passivation film 8 can be formed in a range from 100 to 2000 Å by using a PECVD method, a vapor deposition method, a sputtering method, or the like. For this reason, with respect to the structure of the second surface 9b side of the semiconductor substrate 9, a PERC (Passivated Emitter and Rear Cell) structure or a PERL (Passivated Emitter Rear Locally-diffused) structure may be used.

Moreover, in the same manner as in the first electrode 4, the second electrode 5 may have a shape in which the second output extraction electrode and a plurality of linear second collector electrodes that intersect the second output extraction electrode are installed, or may include the conductor layer and a plated layer coating the surface thereof.

Moreover, by controlling the position of the semiconductor substrate 9 to be immersed in the plating bath 21 or controlling the liquid surface level of the electrolytic plating solution 22, a plated layer may be formed on one portion of the first conductor layer 11a adjacent to the second conductor layer 11b.

Furthermore, the line width of the first conductor layer 11a may be made wider from the second conductor layer 11b side toward one end portion of the semiconductor substrate 9. The line width may be made wider step by step or continuously. For example, in the electrode portion from the second conductor layer 11b side toward the first range A or the third range C, the line width may be made wider step by step or continuously to about half the portion, and in the electrode portion in the first range A or the third range C, may be made to have a fixed width from about half the portion to one end portion of the semiconductor substrate 9.

With the above arrangement, even when the plated layer is formed on one portion of the first conductor layer 11a adjacent to the second conductor layer 11b, the width of the electrode is prevented from becoming too wide, making it possible to reduce the reduction of the light-receiving area.

Moreover, on the two end portions of the first collector electrodes 4b that intersect the longitudinal direction thereof, by forming the linear auxiliary electrodes 4c that intersect with each first collector electrode 4b, it becomes possible to allow an electric current supplied from the power feeding unit 25 to uniformly flow through the first electrode 4, and consequently to form the plated layer 12 with a uniform thickness. Moreover, the auxiliary electrode 4c may include the conductor layer 11 and the plated layer 12. With this arrangement, even if disconnection in a portion of the first collector electrode 4b occurs, the rise of the resistivity is lowered, and the current is desirably allowed to flow through the first output extraction electrode 4a through another first collector electrode 4b.

Moreover, the plated layer 12 may be formed after the second electrode 5 has been formed. In this case where there is no need to flow an electric current from the power feeding unit 25 through the second electrode 5, an insulating layer may be formed on the contact portions. This arrangement is preferable since no plated layer 12 is formed on unnecessary portions.

Furthermore, on the intersection between the first collector electrode 4b (second conductor layer 11b) and the first output extraction electrode 4a (third conductor layer 11c) or on the intersection between the first collector electrode 4b and the auxiliary electrode 4c, the width of the first collector electrode 4b (second collector layer 11b) may be made wider toward the first output extraction electrode 4a (third conductor layer 11c) or the auxiliary electrode 4c. Since the line width of the second conductor layer 11b on which the plated layer 12 is formed is very narrow, there is a possibility that disconnection might occur in the intersection between the second conductor layer 11b and the first output extraction electrode 4a (third conductor layer 11c) or the auxiliary electrode 4c that extends perpendicularly to the longitudinal direction of the second conductor layer 11b; therefore, by widening the line width of the second conductor layer 11b at the intersection portion, it becomes possible to reduce the occurrence of disconnection.

Solar Cell Module

The following description will describe a solar cell module in which one or more solar cell elements 10 of the present embodiment are installed. An explanation will be given below by exemplifying a solar cell module 30 including a plurality of the solar cell elements 10 electrically connected with one another.

In the case where the electric output of the individual solar cell element 10 is small, a plurality of the solar cell elements 10 are connected in series with, and in parallel with one another so that a solar cell module 30 is formed. By combining a plurality of these solar cell modules 30 with one another, a practical extraction of electric output is available.

Figure 7A:
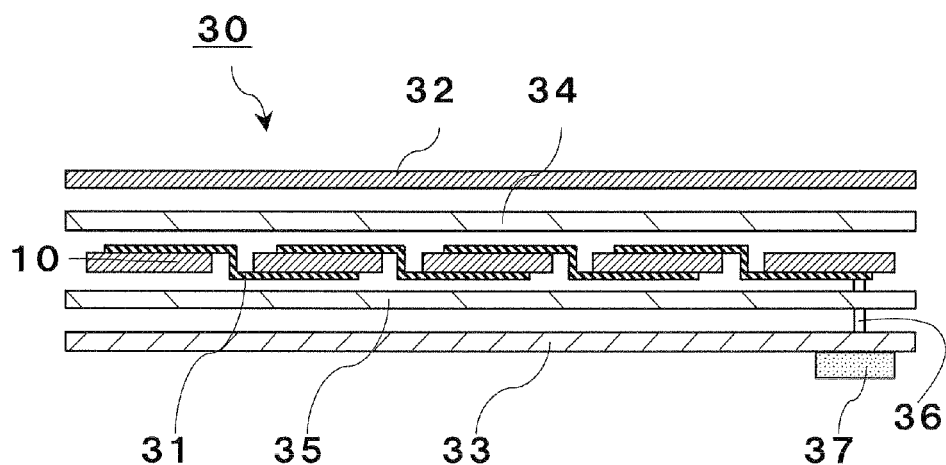
FIGS. 7A and 7B are views schematically showing one example of a solar cell module in accordance with one embodiment of the present invention.

As shown in FIG. 7A, the solar cell module 30 is mainly constituted by a transparent member 32 comprised of, for example, glass or the like, a surface-side filler 34 comprised of a transparent EVA (ethylene vinylacetate) or the like, a plurality of solar cell elements 10, each formed by alternately connecting the first electrode 4 and the second electrode 5 of the adjacent solar cell elements 10 with each other by wiring members 31, a rear-side filler 35 comprised of EVA or the like, and a rear-surface protective member 33 formed by sandwiching PET (polyethylene terephthalate) or a metal foil with PVF (polyvinyl fluoride) members. The mutual adjacent solar cell elements 10 are connected by wiring members 31, each formed by coating the entire surface of a copper foil having, for example, a thickness of about 0.1 to 0.2 mm and a width of about 2 mm, with a solder material, are used.

Figure 7B:
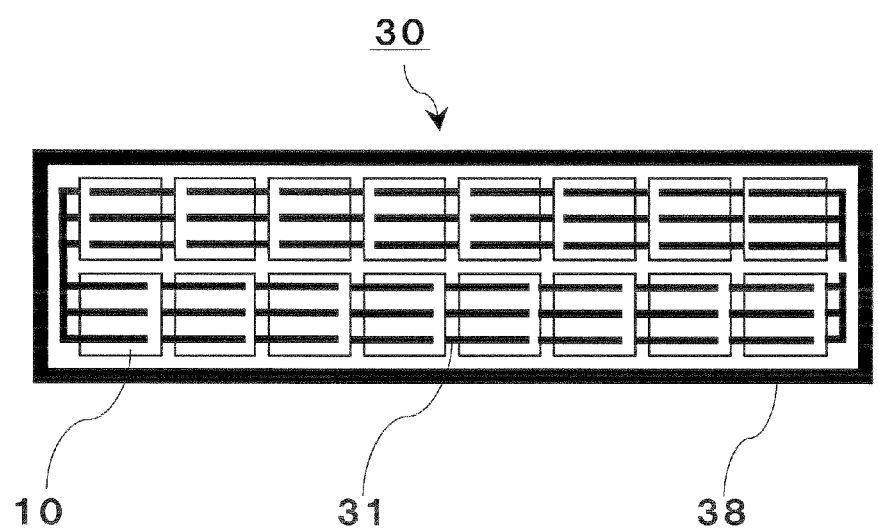

Moreover, of the plurality of solar cell elements 10 series-connected with one another, one end of each of the electrodes of the solar cell element 10 located at the first position of the series connection and one end of the solar cell element 10 located at the last position thereof are connected to a terminal box 37 serving as an output extraction unit by an output extraction wire 36. Moreover, although not shown in FIG. 7A, as shown in FIG. 7B, the solar cell module 30 may be provided with a frame 38 comprised of aluminum or the like.

In accordance with the solar cell module 30 of the present embodiment, it is possible to provide a solar cell module having superior characteristics with better output conversion efficiency in comparison with the conventional module.

Examples

The following description will describe more specific examples. First, as the semiconductor substrate 9, a large number of polycrystalline silicon substrates, each having a thickness of about 200 µm, an outer shape of 156 mm×156 mm and a specific resistance of 1.5 Ω·cm were prepared. As these polycrystalline silicon substrates, those prepared with boron doped therein so as to preliminarily have a p-type conductivity were used.

On the first surface 10a side of each polycrystalline silicon substrate thus prepared, by using a RIE (Reactive Ion Etching) method, an uneven structure 9c, as shown in FIG. 3, is formed. Next, by diffusing phosphorus atoms, an n-type reverse conductivity-type layer 2 having a sheet resistivity of about 90Ω/ was formed. Then, on the first surface 9a side, an anti-reflection layer 3 comprised of a silicon nitride film was formed by using a plasma CVD method. Moreover, an aluminum paste was applied onto virtually the entire surface of the second surface 9b side, and this was then fired so that a BSF region 6 and a second collector electrode 5b were formed.

Next, a silver paste was applied onto the first surface 10a, and this was then fired so that conductor layers (first conductor layer 11a, second conductor layer 11b and third conductor layer 11c) were formed. The regions where the second conductor layer 11b and the third conductor layer 11c are formed (in type I, however, with regard to the third conductor layer 11c, only one portion thereof) were immersed in an electrolytic plating solution 22, and the plated layer 12 comprised of copper was thus formed on the second conductor layer 11b and the third conductor layer 11c (in type I, however, only one portion thereof) so that a first electrode 4 was formed.

Moreover, a silver paste was applied to the second surface 10b, and this was then fired so that a second output extraction electrode 4a was formed.

Lastly, on peripheral portions on the second surface 9b side of the silicon substrate, pn-isolation is performed using a laser beam or the like so that each solar cell element 10 was formed.

The electrode structure of the solar cell element 10 of type I was prepared as an electrode structure shown in FIGS. 4A to 4D. The electrode structure of the solar cell element 10 of type II was prepared as an electrode structure shown in FIGS. 5A to 5D. Moreover, on each of the solar cell elements 10 of type I and type II, the first conductor layer 11a was formed within a range of 5 mm from one of the ends, and its line width was set to 90 µm, with its thickness being set to 4 µm. The second conductor layer 11b was formed within a wider range on the other end side, and its line width was set to 40 µm, with its thickness being set to 2 µm. The third conductor layer 11c was formed with its line width being set to 1.5 mm and its thickness being set to 2 µm. The thickness of the plated layer 12 was 10 µm. Moreover, on the solar cell element 10 of type I, the power feeding unit 25 was attached to the third conductor layer 11c, and on the solar cell element 10 of type II, the power feeding unit 25 was attached to the second conductor layer 11b, and the plated layer 12 was formed thereon, without the power feeding unit 25 being immersed in the plating solution 22.

Moreover, as a comparative example, a silver paste was applied, and this was then fired so that solar cell elements, each of which was comprised of the first electrode 4 including the first collector electrode with a width of 90 µm and a thickness of 15 µm, and the first output extraction electrode with a line width of 1.5 mm and a thickness of 15 µm, were formed.

Next, with respect to each of type I, type II and the comparative example, output characteristics of the solar cell element (voltage, current density, fill factor and conversion efficiency) were measured and evaluated. Table 1 shows the results thereof. In this case, measurements of these characteristics were carried out under conditions of an AM (Air Mass) of 1.5 and irradiation of 100 mW/cm$^2$, in accordance with JISC 8913.

TABLE 1

| | Voltage [V] | Current Density [mA/cm$^2$] | Fill Factor [—] | Conversion Efficiency [%] |
|---|---|---|---|---|
| Type I | 0.619 | 35.50 | 0.774 | 17.01 |
| Type II | 0.618 | 35.59 | 0.772 | 16.98 |
| Comparative Example | 0.618 | 35.01 | 0.770 | 16.66 |

As shown in Table 1, it was confirmed that each of the solar cell elements 10 of type I and type II had high current density, fill factors and conversion efficiency in comparison with those of the comparative example. Moreover, since no plated layer 12 was formed on the power feeding unit 25, it was possible to eliminate the removing process of the plated layer 12, and consequently to greatly improve the productivity.

DESCRIPTION OF SYMBOLS

1: One-conductivity-type region
2: Reverse conductivity-type layer
3: Anti-reflection layer
4: First electrode
4a: First output extraction electrode
4b: First collector electrode
4c: Auxiliary electrode
5: Second electrode
5a: Second output extraction electrode
5b: Second collector electrode
6: BSF region
9: Semiconductor substrate
10: Solar cell element
11: Conductor layer
11a: First conductor layer
11b: Second conductor layer
11c: Third conductor layer
12: Plated layer
21: Plating bath
22: Electrolytic plating solution
23: Anode
24: Cathode
25: Power feeding unit 26: Power supply
30: Solar cell module

The invention claimed is:

1. A solar cell element comprising:
a semiconductor substrate; and
a collector electrode including a plurality of conductor portions elongated in a first direction on one main surface of the semiconductor substrate,
wherein the plurality of the conductor portions comprise: a linear first conductor region not including a plated surface; and a linear second conductor region including a plated surface, the linear second conductor region being electrically connected to the first conductor region,
the first conductor region includes a first conductor layer,
the second conductor region includes a second conductor layer and a plated layer,
a porosity of the second conductor layer is greater than 5%, and
a porosity of the plated layer is 5% or less.

2. The solar cell element according to claim 1, wherein on the one main surface of the semiconductor substrate, of the plurality of aligned conductor portions, the first conductor region is located on one side in a second direction orthogonal to the first direction and includes a conductor portion located at one end portion on the one side in the second direction, and the second conductor region is located on the other side in the second direction relative to the first conductor region and includes a conductor portion located at another end portion on the other side in the second direction.

3. The solar cell element according to claim 1, wherein a line width in a second direction orthogonal to the first direction of a first conductor layer forming the first conductor region is wider than a line width in the second direction of a second conductor layer included in the second conductor region and to be plated.

4. The solar cell element according to claim 1, further comprising:
an output extraction electrode that intersects with the collector electrode and is electrically connected to the collector electrode.

5. A solar cell module comprising the solar cell element according to claim 1.

* * * * *